(12) United States Patent
Botti et al.

(10) Patent No.: US 7,332,943 B2
(45) Date of Patent: Feb. 19, 2008

(54) METHOD AND CIRCUIT FOR CONTROLLING A PWM POWER STAGE

(75) Inventors: Edoardo Botti, Vigevano (IT); Juri Cambieri, Opera (IT)

(73) Assignee: STMicroElectronics S.r.l., Agrate Brianza (IT)

( * ) Notice: Subject to any disclaimer, the term of this patent is extended or adjusted under 35 U.S.C. 154(b) by 0 days.

(21) Appl. No.: 11/534,803

(22) Filed: Sep. 25, 2006

(65) Prior Publication Data
US 2007/0071086 A1    Mar. 29, 2007

(30) Foreign Application Priority Data
Sep. 23, 2005   (IT)  ............ VA2005A0054

(51) Int. Cl.
*H03B 1/00* (2006.01)
(52) U.S. Cl. .................................... 327/112
(58) Field of Classification Search ........... 327/112; 323/283, 284
See application file for complete search history.

(56) References Cited
U.S. PATENT DOCUMENTS

| 5,191,269 | A | 3/1993 | Carbolante | 318/254 |
| 5,469,096 | A | 11/1995 | Nessi et al. | 327/112 |
| 5,825,215 | A * | 10/1998 | Sugio et al. | 327/108 |
| 6,288,605 | B1 | 9/2001 | Botti et al. | 330/10 |

* cited by examiner

*Primary Examiner*—Shawn Riley
(74) *Attorney, Agent, or Firm*—Lisa K. Jorgenson; Allen, Dyer, Doppelt, Milbrath & Gilchrist, P.A.

(57) ABSTRACT

A method for controlling a PWM power stage is based upon dampening current peaks generated by switching of the PWM power stage. The PWM power stage includes at least two MOS transistors of opposite conductivity coupled between an output node of the PWM power stage and respective positive and negative supply lines, and respective free-wheeling diodes. The method includes forming the at least two MOS transistors such that their reverse conduction threshold voltage is smaller than a sum between their forward conduction threshold voltage and a forward voltage on the respective free-wheeling diode at which a pre-established current flows therethrough. The at least two MOS transistors are in a high impedance state by biasing respective control nodes at a turn-off voltage such that their gate-source voltage is between the forward conduction threshold voltage and a null voltage.

16 Claims, 7 Drawing Sheets

$$\eta = \frac{\overline{P_{load}}}{\overline{P_{alim}}} = \frac{\overline{P_{load}}}{\overline{P_{load}} + \overline{P_{diss}}} = \frac{\overline{P_{load}}}{\overline{P_{load}}} = 1$$

METHOD AND CIRCUIT FOR CONTROLLING A PWM POWER STAGE

FIELD OF THE INVENTION

The invention relates to power stages, and more particularly, to a method and a relative circuit for controlling a power stage that dampens free-wheeling current peaks when the power stage is switched.

BACKGROUND OF THE INVENTION

More and more complex functions are implemented in modern integrated circuit devices that need to be very efficient for keeping as low as possible their operating temperature. Class D audio amplifiers, which are PWM amplifiers, are particularly suitable for satisfying stringent requirements on power dissipation.

The functioning of a class D amplifier is based on the modulation of a high frequency carrier by the signal to be amplified, and on the successive reconstruction of the amplified signal. In particular, in a pulse width modulation (PWM) mode the duty-cycle of a square wave signal, modulated at a constant frequency much greater than the frequency band of the signal to be amplified, is varied depending on the instantaneous value of the input voltage. Ideally, the output signal of a class D amplifier is a square wave, with a fixed period and amplitude adequate to obtain the desired maximum output power. The sole parameter that varies is the duty cycle, that is, the ratio between the time during which the output remains high and the switching period.

Information of the signal to be amplified is contained in the mean value of the output value. This is normally recovered through a low-pass filter with passive L-C components. The reconstruction filter LC makes the output current remain substantially stable around its mean value.

In class A, AB, and B amplifiers, the active element is biased such to dissipate a large power for the entire conduction phase. In class D amplifiers, this does not happen because the transistors ideally always work under conditions of null power consumption: $V_{DS}=0$ when they are in a conduction state (ON); and $I_D=0$ when they are in a non-conductive state (OFF).

Figure 1:
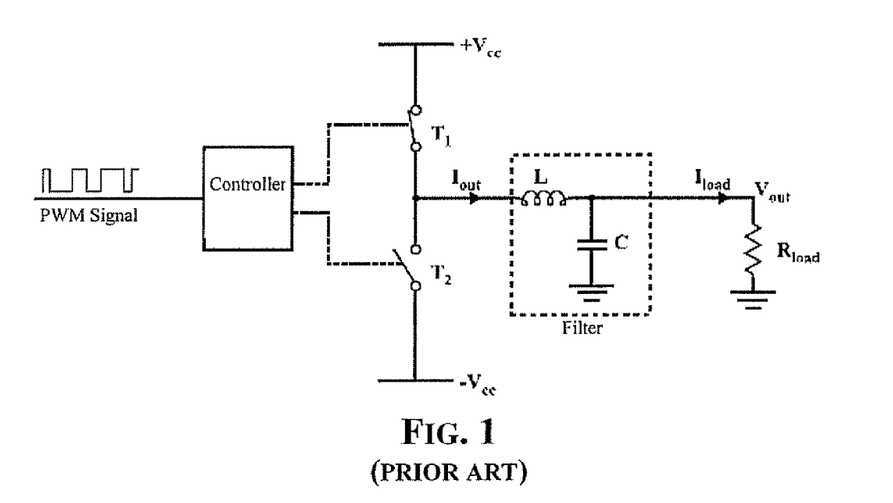
FIG. 1 depicts a class D amplifier in accordance with the prior invention.

Theoretically, the efficiency is 100%, that is, all the power absorbed from the power supply is delivered to the load. FIG. 1 shows the equations for calculating the power and a basic control circuit of the final stage of a PWM half-bridge.

According to a standard technique for driving the power transistors of a half-bridge stage, when the transistor is in a forward conduction state (that is, when out of the dead times and the output is low), the gate-source voltage $V_{GS}$ is kept at a value, for example 6V, equal to that for which the on-state drain-source resistance $R_{DSon}$ is minimum while keeping the integrity of the gate oxide. Thus, the drain current $I_D$ can circulate in both directions depending on the sign of the instantaneous value of Iout.

Figure 2:
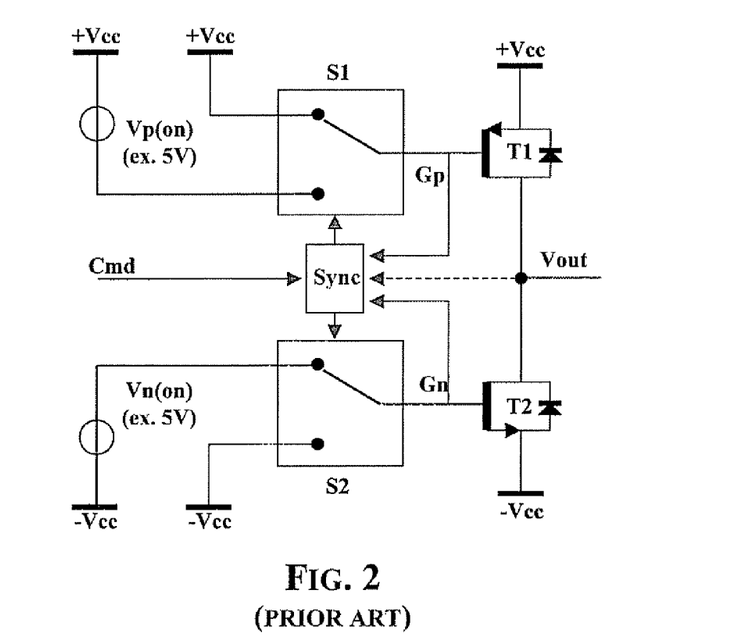
FIG. 2 depicts a control circuit for a half-bridge stage in accordance with the prior invention.

A control circuit that implements this technique is depicted in FIG. 2. The block S<small>YNC</small> indicates a circuit for commanding the switches S1 and S2, which for example may be the circuit disclosed in U.S. Pat. No. 6,288,605 that is assigned to the current assignee of the present invention.

During dead times, the gate-source voltages $V_{GS}$ of the transistors are normally brought to 0V, the transistors are in an OFF state and one of the two free-wheeling diodes is in a conduction state.

A drawback of this type of amplifier is a relatively high electromagnetic emission (EMI) that disturbs other circuits connected to the same supply lines of the amplifier. This problem is particularly felt in devices that include radio receivers, such as for example car radios, GPS, cellular phones and the like because the emissions generated by the amplifier may interfere with signals coming from antennas.

Electromagnetic interferences (EMI) are due to abrupt variations of the voltage or of the current and to relatively high values of the time derivative of voltages or currents in the power stage. Because of the functioning mode of class D amplifiers, it is difficult to avoid abrupt variations of the output voltage, thus they will always generate electromagnetic disturbances or EMI. Nonetheless, it is well known that there are other causes of electromagnetic emissions in class D amplifiers that may be effectively limited.

The free-wheeling diode that is normally present in every output power stage that drives an inductive load, causes current peaks that may also generate electromagnetic interferences. Typically, in a half-bridge stage, the free-wheeling or recirculation diode is connected in parallel to the respective power transistors T1 and T2, and is either integrated with the power MOS device or it is intrinsic to the integrated structure of the power MOS device, as shown in FIG. 3.

As it is well known and explained in the article by M. Berkhout, "An Integrated 300-W Class-D Audio Amplifier", IEEE Journal of Solid-State Circuits, Vol. 48, No. 9, July 3003, the free-wheeling diode needs a non-null time for passing from the conduction state to the OFF state generates EMI.

The presence of a dead time, that is, a time interval during which both switches are turned off and the output current is kept practically constant by the LC filter, causes the turning on of one of the free-wheeling diodes during the dead time.

Figure 3:
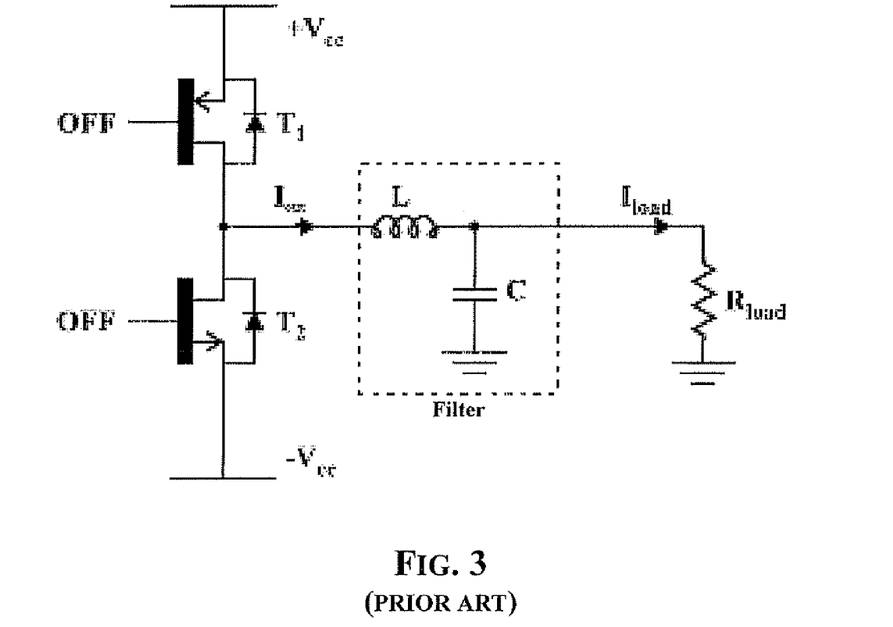
FIG. 3 depicts a half-bridge stage that drives a load in accordance with the prior invention.

To understand how EMI is generated when a free-wheeling diode switches from a conduction state to a cut-off state, let us consider the situation depicted in FIG. 3, where the MOS transistors T1 and T2 are off and the first transistor to turn on is T1. In this situation, the free-wheeling diode in parallel to the MOS transistor T2 is in a conduction state.

The critical phase starts when the MOS transistor T1 enters in a conduction state. When the transistor T1 is on, the output voltage Vout needs to reach the positive supply voltage. Even if relatively short, the diode D2 needs a certain time for turning off, and during this time the voltage on its nodes is kept practically constant.

In this situation, the MOS transistor T1 works in a saturation zone with a $V_{GS}$ that becomes sufficiently high to circulate a relatively large current (about 15-20 A). This large current lets minority carriers recombine in the diode by turning it off in a very short time (on the order of tenths of ns), and the output voltage Vout reaches the positive supply voltage. Therefore, there is a very short time interval in which the MOS transistor T1 and the free-wheeling diode of the MOS transistor T2 are both in a conduction state. Thus, the power supplies are shorted and a narrow current pulse of very large amplitude circulates through the supply lines.

With the illustrated control technique, a signal having a broad high frequency spectrum is forced through the supplies, and it is capable of disturbing the functioning of electronic circuits connected to the same supply line.

Figure 4:
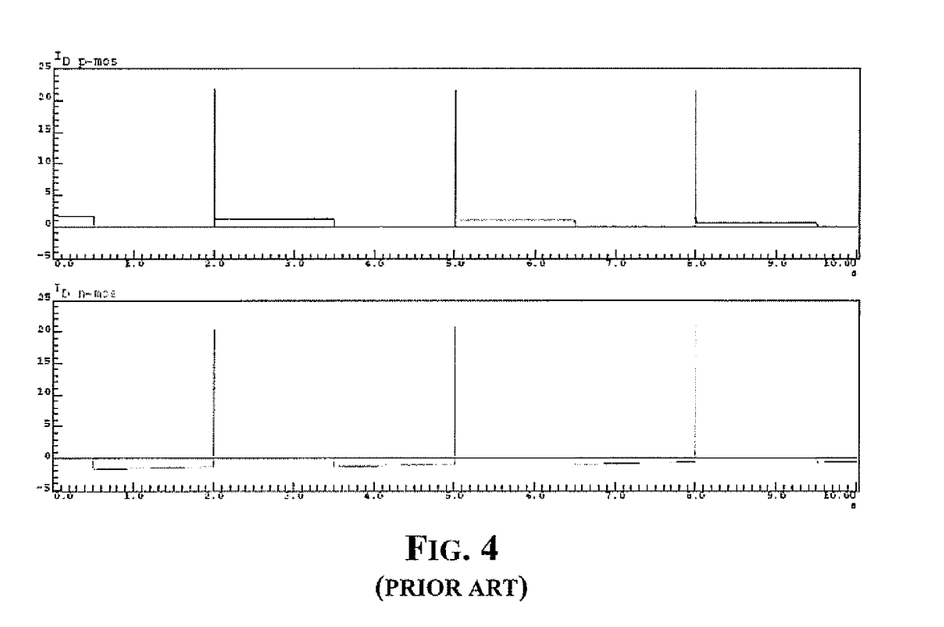
FIG. 4 depicts waveforms of current flowing through the transistors of the stage of FIG. 3.

FIG. 4 depicts typical waveforms of the current flowing in the MOS device of the half-bridge, with evident cross-conduction peaks between the positive and negative power supplies, due to the above-illustrated phenomenon.

Figure 5:
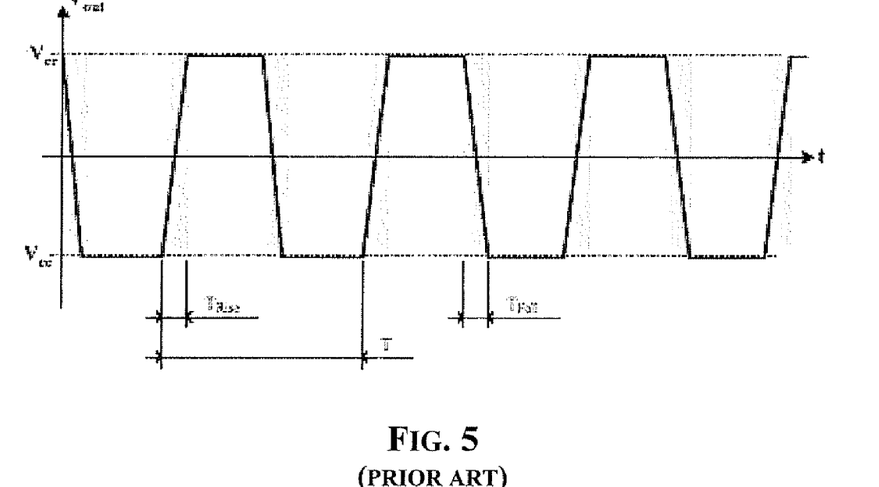
FIG. 5 depicts a typical waveform of the output voltage of the half-bridge stage of FIG. 3.

The output voltage Vout of the switching stage may be approximated with a square wave with infinitely steep edges only at a first level of approximation. It is better modeled with a trapezoidal wave of non-null rise and fall times as illustrated in FIG. 5. This waveform has a spectrum that may be calculated as the product of the spectrum of a rectangular signal of duration Ton with the spectrum of another rectangular signal of duration Trise (rise time).

Figure 6:
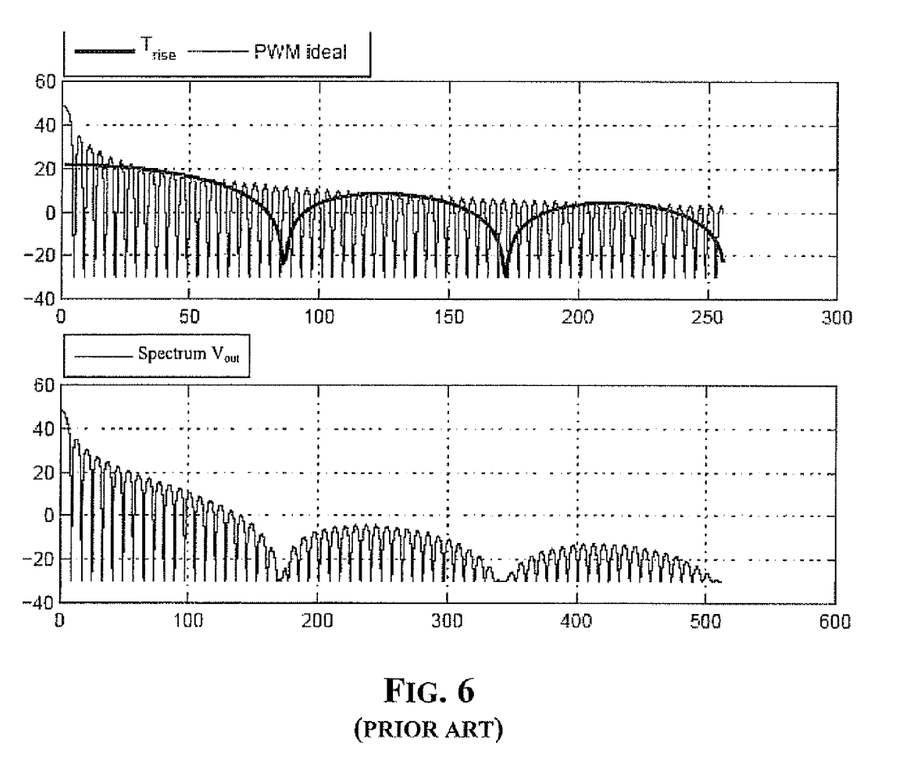
FIG. 6 compares the ideal spectrum with the real spectrum of the output voltage of the half-bridge stage of FIG. 3.

These spectra are described by sinc functions of different periods. FIG. 6 compares the spectra of an ideal output voltage, wherein a sinc function the zeros are at frequencies very close to each other, are enveloped by the function with zeroes at frequencies more distant from each other, and of the output effective voltage Vout.

By adjusting the slope of the transition edges ON-OFF and OFF-ON, it is possible to obtain spectral zones at pre-established frequencies in which the harmonic components of the output voltage are attenuated.

Figure 7:
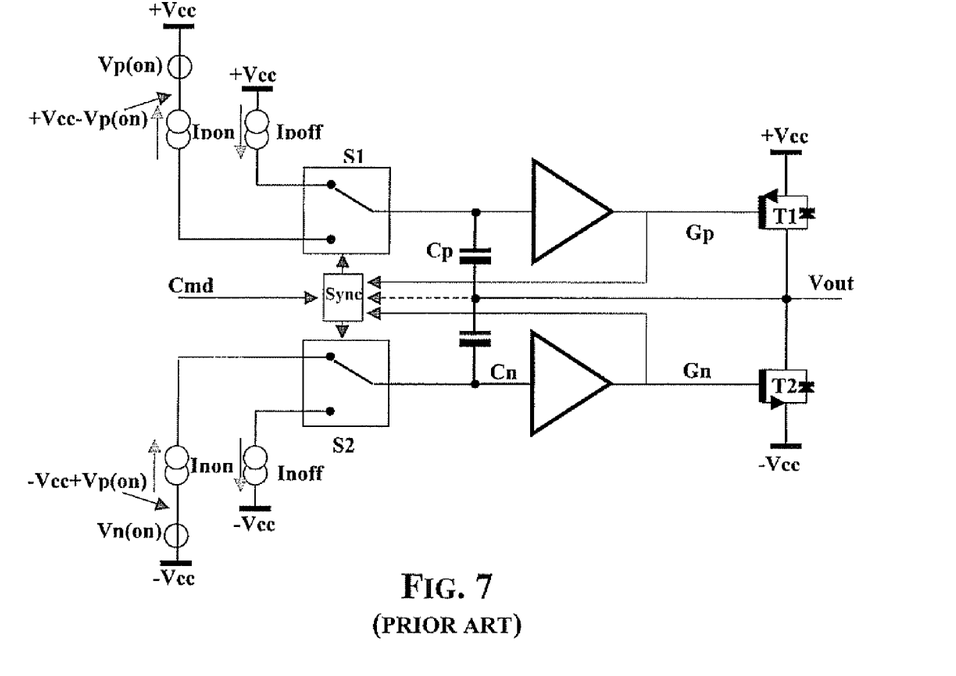
FIG. 7 depicts a control circuit for a half-bridge stage with adjustment of the slope of the edges of the output voltage in accordance with the prior invention.

FIG. 7 depicts a basic scheme of a known PWM driver with control of the slopes of the switching edges of the output voltage. In this case, the power MOS transistors are driven by a buffer of a unitary gain, and the current generators Ip(on) and Ip(off) are connected in input thereto.

The generator Ip(off) is connected when the transistor T1 needs to be turned off. It may be for example realized with a P-channel MOS or a bipolar PNP transistor biased to work as a constant current generator that turns off when the voltage input to the buffer reaches the maximum voltage +Vcc. In this situation, the P-channel MOS transistor or the bipolar PNP transistor does not inject anymore a current through the capacitor Cp.

The generator Ip(on) is connected when the MOS transistor T1 needs to be turned on and it may be realized with an N-channel MOS transistor or a bipolar NPN transistor. As for the generator Ip(off), it does not inject any current through the capacitor Cp when the output voltage reaches the minimum value +Vcc−Vp(on).

The current input to the buffer is negligible, thus the voltages on the capacitors Cp or Cn, feedback from the node on which the output voltage Vout is produced and the inputs of the buffer, may vary with a slope that is a function of the ratio Ip/Cp and In/Cn.

Because the transitions of the output voltage take place at a gate voltage that is practically constant compared to the output voltage swing, the edges of the output voltage should have similar slopes that may be easily controlled by regulating the currents Ip and In.

Moreover, the frequencies at which the zeroes of the envelope are located, depend on the duty-cycle of the output voltage, but only on the slope of the switching edges. Therefore, once the slew-rate with which the output voltage must switch and also the frequency band at which the low emission is fixed, will no longer depend on the value of the input voltage of the amplifier.

Nonetheless, a trade-off is necessary between the location of the zero and the efficiency of the amplifier. The efficiency of a class D amplifier is ideally equal to 100% if power dissipation in the active elements (MOS transistors) of the amplifier is negligible.

This ideal situation would be reached only if switching times of the output and the on resistances of the transistors were both null. As a matter of fact, none of these two parameters can be made absolutely null.

The power consumption of the amplifier varies linearly with the ratio between the switching time Trise and the period T. The longer the Trise, the greater the power dissipation. Thus, it is possible to obtain a substantial reduction of electromagnetic interference at the cost of reducing the efficiency of the class D amplifier.

This approach is applied in a method of controlling the switching of a brushless motor, disclosed in the U.S. Pat. No. 5,191,269. A system of controlling the switching slew-rate of a power stage is disclosed in the U.S. Pat. No. 5,469,096.

SUMMARY OF THE INVENTION

An object of the invention is to provide a method and a relative control circuit for a power stage with reduced electromagnetic emissions due to the switching of the half-bridge or full-bridge stage.

The control circuit effectively prevents current peaks that, in prior art power stages, occur at the turn off of the free-wheeling diodes, thus eliminating a significant source of electromagnetic disturbances.

This result is reached substantially through the following method in which the power transistors are realized such that their reverse conduction threshold voltage is smaller than the sum between the forward conduction threshold voltage and a certain forward voltage on the free-wheeling diode, at which a certain current flows through the diode, and the MOS transistors are turned off by biasing them with a turn off voltage such that the gate-source voltage is between the null voltage and the forward conduction threshold voltage.

The MOS transistors thus enter a reverse conduction state when on the respective recirculation (free-wheeling) diode there is a forward voltage drop. As a result, the power transistors participate together with the diodes in letting the free-wheeling current circulate, thus limiting the current that flows through the diodes when they are turned off. Preferably, this forward voltage corresponds to (is equal to) the threshold voltage of the free-wheeling diode.

BRIEF DESCRIPTION OF THE DRAWINGS

The invention is described in detail referring to the attached drawings, wherein.

DETAILED DESCRIPTION OF THE PREFERRED EMBODIMENTS

To better illustrate the invention, reference will be made to the case in which the power stage is in the form of a half-bridge stage, but the same considerations hold also for full-bridge power stages. It has been shown that the way the free-wheeling diodes are turned off at the end of the dead times causes the generation of strong cross-conduction current pulses. Investigations carried out for solving the problem led to the conclusion that a way of securely preventing the diodes from being activated during the dead times includes letting the output current Iout flow through an alternative path.

The MOS transistors are also exploited for letting the free-wheeling current flow while preventing excessively large voltage drops on the free-wheeling diodes. The MOS transistors are, from an electrical point of view, substantially symmetrical structures and thus they are capable of letting the current flow from the drain to the source and vice-versa independently from the fact that they are P-channel instead or N-channel. Thus, they are capable of permitting a free-wheeling current flow through them.

To better understand this aspect, let us consider for example the situation depicted in FIG. 3, in which the transistor T2 (N-MOS) is turned on. In this situation, which is a normal functioning condition of a class D amplifier, the current $I_D$ is forced to circulate in the indicated direction. This causes the drain terminal to be at a voltage lower than that of the source, and thus lower than the ground potential (drain below the ground potential). The roles of the drain and source terminals are thus inverted: now it is the drain that injects electrons in the channel while the source collects them.

Even from the point of view of the threshold voltage, the roles are inverted. It is between the gate and drain that a voltage larger than the threshold voltage should drop in order to make the current $I_D$ flow. Considering that the body region of the component is grounded and the drain, that in a reverse conduction state assumes the same role of the source in a forward conduction state, is below ground potential, there is a favorable contribution of the so-called body effect that reduces the threshold voltage in respect to what takes place in a forward conduction state.

To make the MOS transistor conduct a current during the dead times, the gate-source voltage $V_{GS}$ is not brought to zero for turning off the MOS transistors, but it is kept at a positive value smaller than the forward conduction threshold voltage $V_{th\_dir}$:

$$0 < V_{GS} < V_{th\_dir} \quad (1)$$

Therefore, the MOS transistors behave like a diode. For voltages $V_{DS} > 0$ current is not circulated because the forward conduction threshold voltage has not been reached (thus $I_D = 0$). For voltages $V_{DS} < 0$, the roles of the drain and source terminals are inverted. If the gate-drain voltage $V_{DG}$ surpasses the reverse conduction threshold voltage $V_{th\_inv}$, the current $I_D$ may flow in the same direction in which it would flow in the free-wheeling diode.

To use this technique for turning on the MOS transistors before the respective free-wheeling diodes, it is necessary that the transistors be realized such that the following inequality be satisfied:

$$V_{th\_inv} < V_{th\_dir} + V_{th\_d} \quad (2)$$

where $V_{th\_d}$ is the threshold voltage of the diode.

This condition may be easily satisfied with modern fabrication technologies used for realizing in integrated form the circuit of the invention using a gate-source driving voltage of the MOS equal to or smaller than 5V.

According to a less preferred embodiment, the MOS transistors are realized such that:

$$V_{th\_inv} < V_{th\_dir} + V_{pre} \quad (3)$$

where $V_{pre}$ is a pre-established voltage higher than the threshold voltage of the diode. If $V_{pre}$ is relatively slightly larger than the threshold voltage of the free-wheeling diodes, the MOS transistor enters in a reverse conduction state shortly after the relative free-wheeling diodes have entered a conduction state. Obviously, this reduces the amplitude of current peaks flowing through the diodes, even if the amount of this reduction is smaller than that in the case considered in eq. (2).

Figure 8:
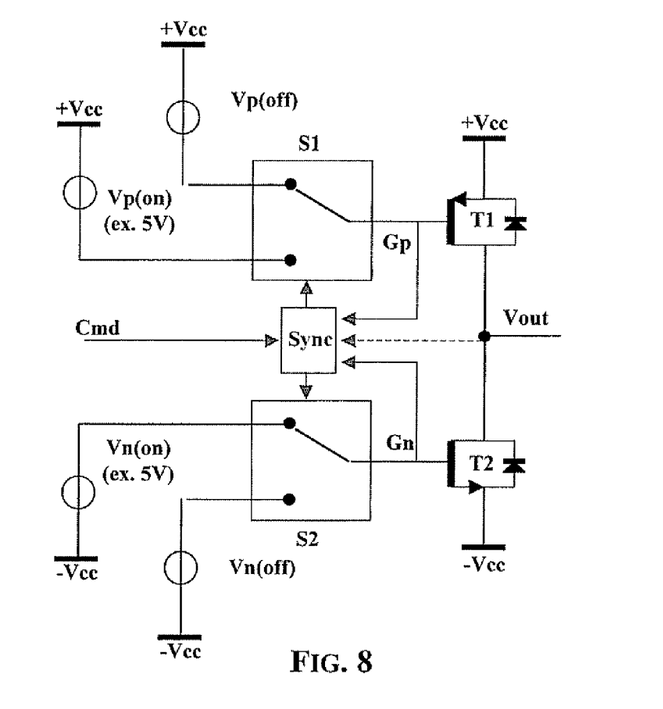
FIG. 8 depicts a control circuit in accordance with the present invention.

A control circuit for a half-bridge stage mode according to the invention is depicted in FIG. 8. Through the switches S1 and S2, properly driven by the block Sync (already mentioned in reference to FIG. 2) to prevent the simultaneous conduction of the power devices, the MOS transistors are alternately turned on and off.

While according to the prior art the turn off command is imparted by nullifying the gate-source voltage. In this case, the control terminal (gate) of the transistor to be turned off is connected to a dedicated generator Vp(off) or Vn(off) of a positive voltage smaller than the forward conduction threshold voltage of the respective power MOS transistor. These voltages Vp(off) and Vn(off) are such that at a below ground or boosted recirculation voltage on the diodes smaller than that for which the free-wheeling diodes are significantly turned on, the power MOS transistors are also turned on. This locks the recirculation voltage, and limits its value.

Figure 9:
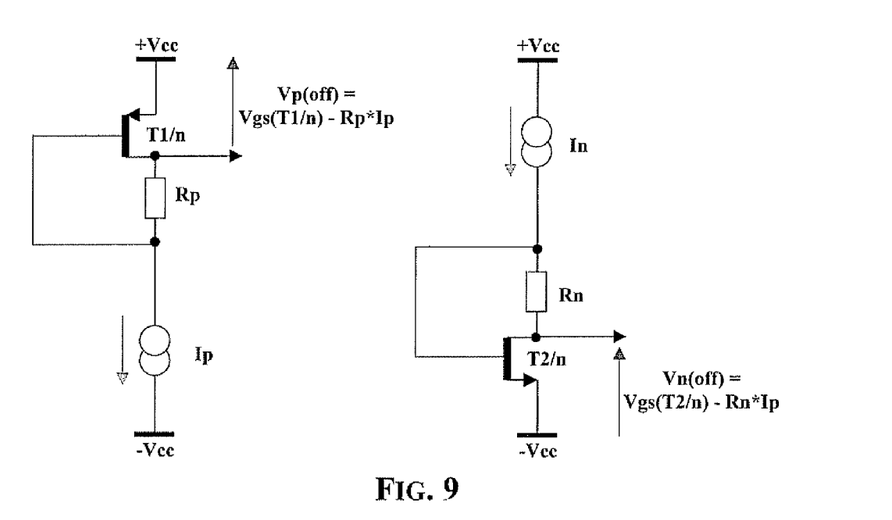
FIG. 9 depicts two generators of the turn-off voltages of the P-type MOS transistor and the N-type MOS transistor of the stage of FIG. 3.

Differently from what happens with a junction diode, a current peak is not generated by turning off a MOS transistor from a reverse conduction state. Examples generators providing positive turn off voltages but smaller than the threshold voltage of the respective power MOS transistor are indicated in FIG. 9. The transistors used are of the same type of the power MOS transistor and, in order to minimize silicon area requirements, they may be realized as scaled replicas of the power MOS transistors. Therefore, generators of a turn off voltage that effectively tracks eventual fluctuations of the threshold voltage of the power MOS transistors are realized.

Figure 10:
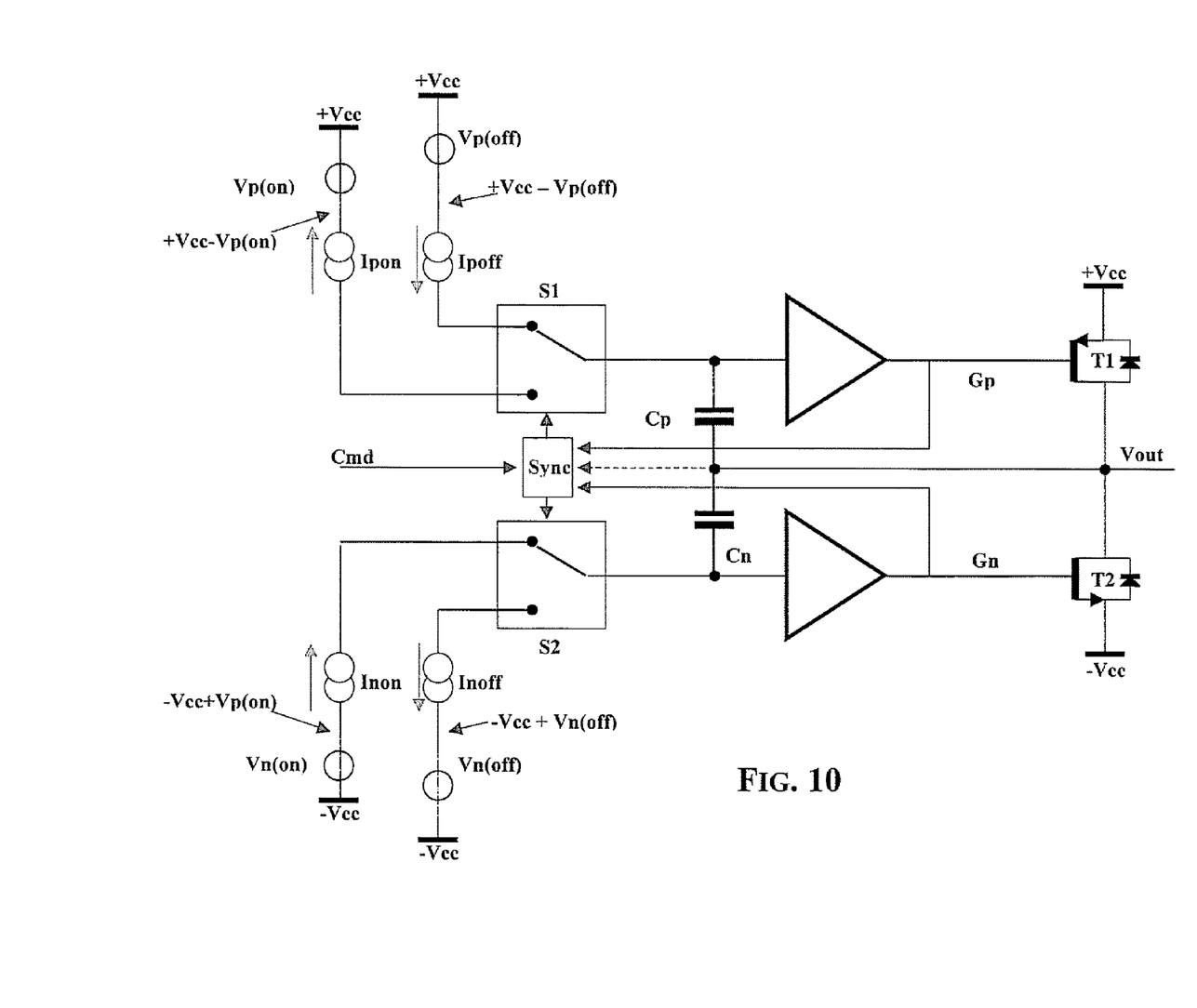
FIG. 10 depicts a control circuit for a half-bridge stage with adjustment of the slope of the edges of the output voltage in accordance with the present invention.

FIG. 10 depicts a control circuit with adjustment of the slopes of the leading and trailing edges of the output voltage Vout.

The architecture is similar to that of FIG. 7, except for the presence of the current generators Ip(off) and In(off), composed of P-channel or N-channel MOS or of PNP or NPN bipolar transistors biased such to function as constant current generators that turn off the power MOS device, and that on their turn are turned off when in input to the buffers there are the voltages +Vcc−Vp(off) and −Vcc+Vn(off)

These voltages ensure that the power transistors, realized to satisfy eq. (2), lock the eventual boosted voltage or below ground voltage by entering in a conduction state aiding the free-wheeling diodes, or even prevent the latter from entering in a conduction state.

Figure 11:
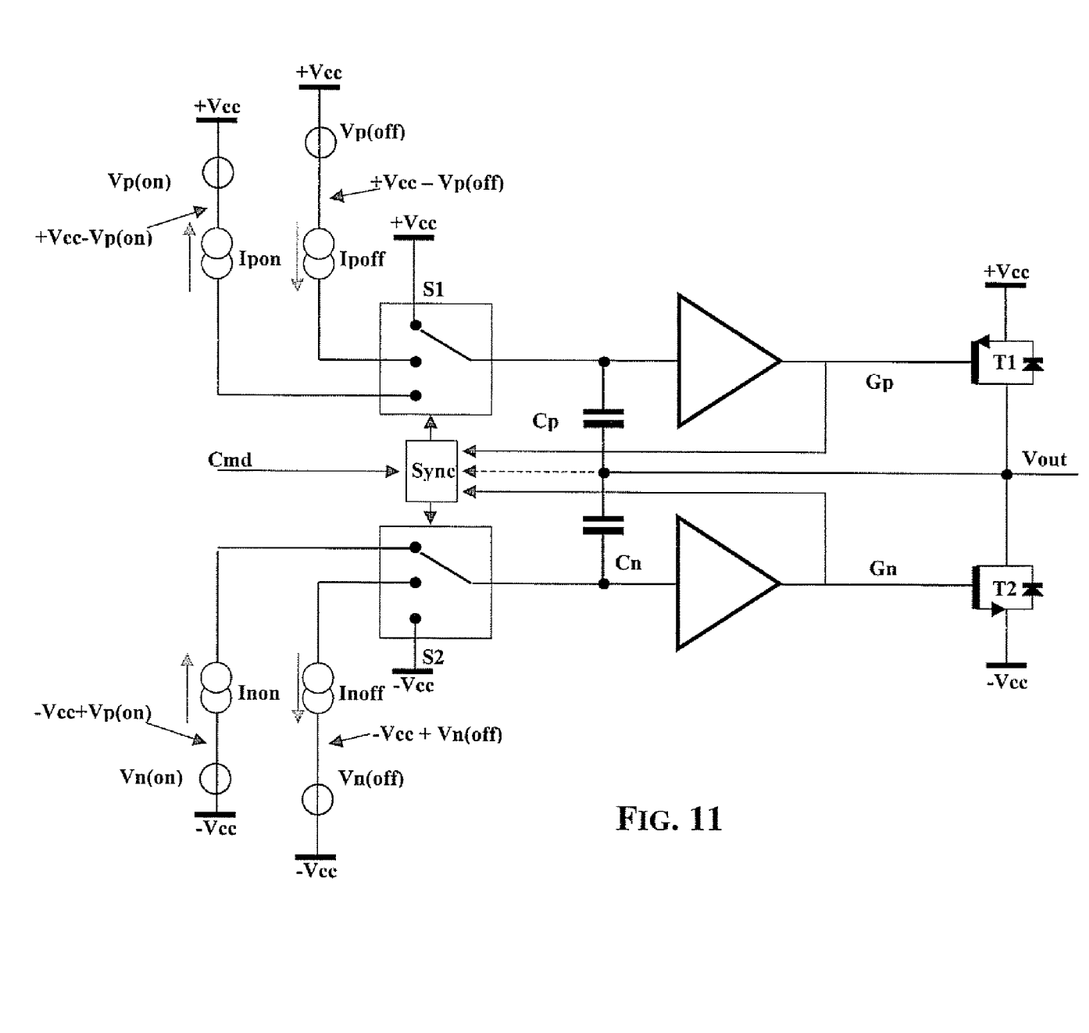
FIG. 11 depicts an alternative embodiment of the circuit of FIG. 10 wherein the MOS transistors may be turned off by connecting the respective control nodes to the supply.

To prevent that abrupt variations of the output voltage, the power transistor may turn on spuriously when it should remain off, three-input deviators S1 and S2, as shown in FIG. 11 may be employed. The deviators S3 and S2 allow one to bring to +Vcc or to −Vcc the gate voltages of the P-channel or N-channel MOS transistor, in order to prevent spurious turn on.

The block SYNC establishes the positions of the two deviators as a function of the input signal, of the output voltage and of the control voltages Gp and Gn of the power transistors such to prevent simultaneous conduction state of the MOS; turn on of the free-wheeling diodes; and spurious turn on of the MOS transistor.

The control circuit is not more complex to be realized than the correspondent traditional circuits, and allows control of a switching power stage causing sensibly reduced electromagnetic disturbances.

Since current peaks due to free-wheeling diodes often make difficult a monolithic integration of the control circuit with the relative power stage, because of over voltages that arise on the parasitic inductances of the bonding wires and of the external connections, the architecture of FIG. 11 substantially overcomes this restraint.

Figure 12:
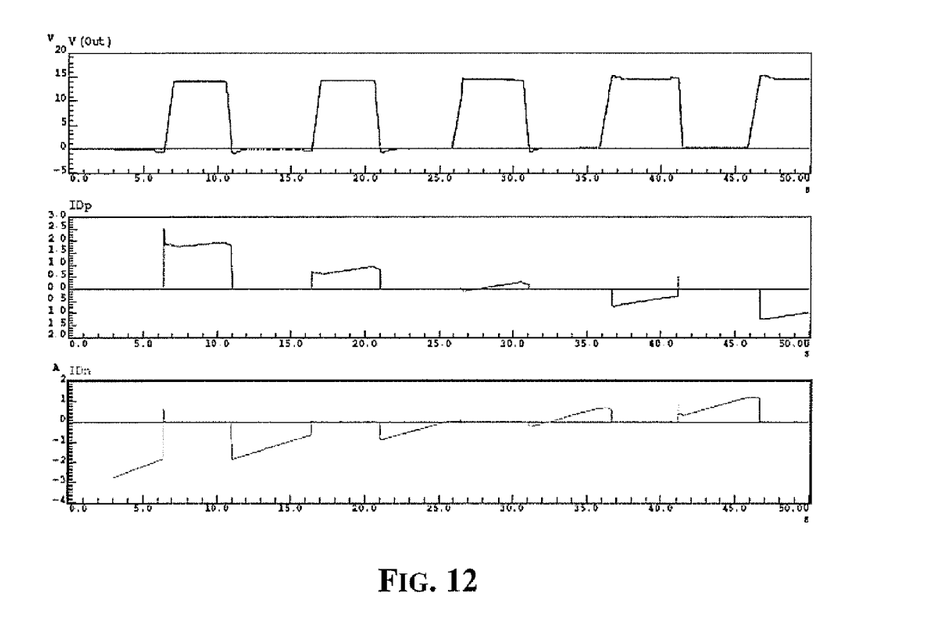
FIG. 12 depicts waveforms of the output voltage of the half-bridge stage of FIG. 11 obtained by simulations.

FIG. 12 depicts waveforms obtained through simulations of the functioning of the circuit of FIG. 11, of the current flowing through the power transistors and the waveform of the output voltage. Even by varying the output current in a relatively large interval, the current peaks that were observable in FIG. 4 are absent.

That which is claimed:

1. A method for controlling a PWM power stage comprising at least two MOS transistors of opposite conductivity coupled between an output node of the PWM power stage and respective positive and negative supply lines; and respective free-wheeling diodes, the method comprising:
   dampening current peaks generated by switching of the PWM power stage by
      forming the at least two MOS transistors such that their reverse conduction threshold voltage is smaller than a sum between their forward conduction threshold voltage and a forward voltage on the respective free-wheeling diode at which a pre-established current flows therethrough, and
      setting the at least two MOS transistors in a high impedance state by biasing respective control nodes at a turnoff voltage such that their gate-source voltage is between the forward conduction threshold voltage and a null voltage.

2. A method according to claim 1, wherein the forward voltage is a forward voltage of the respective free-wheeling diode.

3. A method according to claim 1, wherein each MOS transistor is turned on or off by switching the respective control node between the turn-off voltage and a turn-on voltage or vice-versa, such that a voltage on the output node varies with a pre-established slew-rate.

4. A method for reducing electromagnetic disturbances generated by a PWM power stage having at least two MOS transistors of opposite conductivity connected between an output node of the PWM power stage and respective positive and negative supply lines; and respective free-wheeling diodes, the method comprising:
   forming the at least two MOS transistors such that their reverse conduction threshold voltage is smaller than a sum between their forward conduction threshold voltage and a forward voltage on the respective free-wheeling diode at which a pre-established current flows therethrough, and
   setting the at least two MOS transistors in a high impedance state by biasing respective control nodes at a turn-off voltage such that their gate-source voltage is between the forward conduction threshold voltage and a null voltage for dampening current peaks generated by switching of the PWM power stage.

5. A method according to claim 4, wherein the forward voltage is a forward voltage of the respective free-wheeling diode.

6. A method according to claim 4, wherein each MOS transistor is turned on or off by switching the respective control node between the turn-off voltage and a turn-on voltage or vice-versa, such that a voltage on the output node varies with a pre-established slew-rate.

7. A control circuit for controlling a PWM power stage comprising at least two MOS transistors of opposite conductivity connected between an output node of the PWM power stage and respective positive and negative supply lines; and respective free-wheeling diodes, the control circuit comprising:
   at least two deviators coupled to the at least two MOS transistors, each deviator for coupling a control terminal of a respective MOS transistor to a respective turn-on voltage or turn-off voltage;
   at least two voltage generators for generating the turn-off voltages for the at least two MOS transistors; and
   the at least two MOS transistors having a reverse conduction threshold voltage smaller than a sum between a forward conduction threshold voltage and a forward voltage on a respective free-wheeling diode at which a pre-established current flows therethrough;
   said at least two voltage generators generating the turn-off voltages such that a gate-source voltage of each MOS transistor is between the forward conduction threshold voltage and a null voltage when the at least two MOS transistors are in a high impedance state.

8. A control circuit according to claim 7, wherein the forward voltage is a threshold voltage of the free-wheeling diode.

9. A control circuit according to claim 7, wherein each voltage generator comprises:
   a transistor configured as a scaled replica of a respective MOS transistor and comprising a source terminal coupled to a first supply voltage of the power stage, a gate terminal and drain terminal;
   a resistor coupled between the gate terminal and the drain terminal of said transistor; and
   a current generator coupled to a second supply voltage of the power stage for biasing said resistor and said transistor, the turn-off voltage being a voltage between the drain terminal and the second supply voltage.

10. A control circuit according to claim 7, further comprising:
   at least two voltage amplifiers coupled to said at least two MOS transistors, each voltage amplifier controlling a respective MOS transistor;
   at least two feedback capacitors coupled to said at least two voltage amplifiers, each feedback capacitor coupled between an input terminal of a respective voltage amplifier and the output node of the power stage;
   at least two charge current generators coupled to said at least two feedback capacitors, each charge current generator coupled to a respective feedback capacitor and having a first terminal connected to a respective turn-on voltage and a second terminal coupled as input to the respective voltage amplifier through one of said deviators, each charge current generator turning off when the respective turn-on voltage is reached on the input terminal of the respective voltage amplifier;

at least two discharge current generators coupled to said at least two feedback capacitors, each discharge current generator having a first terminal coupled to a respective turn-off voltage generator and a second terminal coupled as input to the respective voltage amplifier through one of said deviators, each discharge current generator turning off when the respective turn-on voltage is reached on the input terminal of the respective voltage amplifier.

11. A control circuit according to claim 7, wherein each deviator further couples the control terminal of the respective transistor to a respective supply voltage.

12. A power supply comprising:
a PWM power stage comprising
at least two MOS transistors of opposite conductivity connected between an output node and respective positive and negative supply lines, and
at least two diodes coupled in parallel to said at least two MOS transistors; and
a control circuit coupled to said PWM power stage and comprising
at least two deviators coupled to said at least two MOS transistors, each deviator for coupling a control terminal of a respective MOS transistor to a respective turn-on voltage or turn-off voltage,
at least two voltage generators for generating the turn-off voltages for said at least two MOS transistors, and
said at least two MOS transistors having a reverse conduction threshold voltage smaller than a sum between a forward conduction threshold voltage and a forward voltage on a respective free-wheeling diode at which a pre-established current flows therethrough;
said at least two voltage generators generating the turn-off voltages such that a gate-source voltage of each MOS transistor is between the forward conduction threshold voltage and a null voltage when said at least two MOS transistors are in a high impedance state.

13. A power supply according to claim 12, wherein the forward voltage is a threshold voltage of said free-wheeling diode.

14. A power supply according to claim 12, wherein each voltage generator comprises:
a transistor configured as a scaled replica of a respective MOS transistor and comprising a source terminal coupled to a first supply voltage of the power stage, a gate terminal and drain terminal;
a resistor coupled between the gate terminal and the drain terminal of said transistor; and
a current generator coupled to a second supply voltage of the power stage for biasing said resistor and said transistor, the turn-off voltage being a voltage between the drain terminal and the second supply voltage.

15. A power supply according to claim 12, wherein said control circuit further comprises:
at least two voltage amplifiers coupled to said at least two MOS transistors, each voltage amplifier controlling a respective MOS transistor;
at least two feedback capacitors coupled to said at least two voltage amplifiers, each feedback capacitor coupled between an input terminal of a respective voltage amplifier and the output node of the power stage;
at least two charge current generators coupled to said at least two feedback capacitors, each charge current generator coupled to a respective feedback capacitor and having a first terminal connected to a respective turn-on voltage and a second terminal coupled as input to the respective voltage amplifier through one of said deviators, each charge current generator turning off when the respective turn-on voltage is reached on the input terminal of the respective voltage amplifier;
at least two discharge current generators coupled to said at least two feedback capacitors, each discharge current generator having a first terminal coupled to a respective turn-off voltage generator and a second terminal coupled as input to the respective voltage amplifier through one of said deviators, each discharge current generator turning off when the respective turn-on voltage is reached on the input terminal of the respective voltage amplifier.

16. A power supply according to claim 12, wherein each deviator further couples the control terminal of the respective transistor to a respective supply voltage.

* * * * *